(12) United States Patent
Tseng et al.

(10) Patent No.: US 8,513,796 B2
(45) Date of Patent: Aug. 20, 2013

(54) PACKAGE STRUCTURE, FABRICATING METHOD THEREOF, AND PACKAGE-ON-PACKAGE DEVICE THEREBY

(75) Inventors: Tzyy-Jang Tseng, Taoyuan (TW); Dyi-Chung Hu, Taoyuan (TW); Yu-Shan Hu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 13/413,003

(22) Filed: Mar. 6, 2012

(65) Prior Publication Data

US 2012/0228764 A1    Sep. 13, 2012

(30) Foreign Application Priority Data

Mar. 7, 2011 (TW) .............................. 100107520 A

(51) Int. Cl.
*H01L 23/48*   (2006.01)
*H01L 21/60*   (2006.01)

(52) U.S. Cl.
USPC .... 257/686; 257/737; 257/777; 257/E23.021; 257/E23.028; 257/E23.101; 257/E23.125; 257/E23.133; 257/E23.142; 257/E23.169; 257/E23.178

(58) Field of Classification Search
USPC .......... 257/686, 737, 777, E23.021, E23.028, 257/257/E23.101, E23.125, E23.133, E23.142, 257/E23.169, E23.178
See application file for complete search history.

(56) References Cited

U.S. PATENT DOCUMENTS

| | | | | |
|---|---|---|---|---|
| 6,472,741 B1* | 10/2002 | Chen et al. | ..................... | 257/712 |
| 6,919,631 B1* | 7/2005 | Hoffman et al. | .............. | 257/707 |
| 2001/0000924 A1* | 5/2001 | Karnezos et al. | .............. | 257/666 |
| 2007/0018310 A1* | 1/2007 | Sato | .............................. | 257/706 |
| 2008/0073777 A1* | 3/2008 | Cui et al. | ...................... | 257/707 |

\* cited by examiner

*Primary Examiner* — Peniel M Gumedzoe
(74) *Attorney, Agent, or Firm* — Edwards Wildman Palmer LLP; Peter F. Corless; Steven M. Jensen

(57) ABSTRACT

A package structure, a method of fabricating the package structure, and a package-on-package device are provided, where the package structure includes a metal sheet having perforations and a semiconductor chip including an active surface having electrode pads thereon, where the semiconductor chip is combined with the metal sheet via an inactive surface thereof. Also, a protective buffer layer is formed on the active surface to cover the conductive bumps, and the perforations are arranged around a periphery of the inactive surface of the semiconductor chip. Further, an encapsulant is formed on the metal sheet and in the perforations, for encapsulating the semiconductor chip and exposing the protective buffer layer; and a circuit fan-out layer is formed on the encapsulant and the protective buffer layer and having conductive vias penetrating the protective buffer layer and electrically connecting to the conductive bumps.

12 Claims, 6 Drawing Sheets

PACKAGE STRUCTURE, FABRICATING METHOD THEREOF, AND PACKAGE-ON-PACKAGE DEVICE THEREBY

CROSS-REFERENCES TO RELATED APPLICATIONS

This application claims under 35 U.S.C. §119(a) the benefit of Taiwanese Application No. 100107520, filed Mar. 7, 2011, the entire contents of which is incorporated herein by reference.

BACKGROUND OF THE INVENTION

1. Field of the Invention

The present invention relates to package structures, and, more particularly, to a low-profile package structure, a fabricating method thereof, and a thin-profiled package-on-package device having the package structure.

2. Description of Related Art

Along with the rapid development of electronic industry, electronic product are becoming low-profiled and compact-sized. Their specifications need to comply with the regulations set by Joint Electronic Device Engineering Council (JEDEC), so how they are packaged is quite important. For example, a dynamic random access memory (DRAM) chip is developed toward 40 nm or less, and the chip size thus becomes smaller and smaller. However, the area occupied by a packaged unit is not changed after packaging, so the ball pitch for a package to be mounted on a printed circuit board (PCB) still has to remain as small as 0.8 mm, in order to comply with the JEDEC standard. Accordingly, a fan-out wafer level chip scale package (Fan-Out WLP) is available, wherein a double-data-rate three synchronous dynamic random access memory (DDR3 SDRAM) is a specification for computer memory, and is generally packaged in a Window BGA form.

Referring to FIG. 1, a cross-sectional diagram of a package structure 1 according to the prior art is provided. The package structure 1 includes a packaging substrate 10 having an opening 100, and a semiconductor chip 11 with an active surface 11a disposed on a bottom surface 10b of the packaging substrate 10. The semiconductor chip 11 covers one end of the opening 100. Electrode pads 110 of the semiconductor chip 11 are exposed from the opening 100. The electrode pads 110 are electrically connected to bonding pads 101 on a top surface 10a of the packaging substrate 10 by gold wires 12. A protective material 14 is filled in the opening 100 to cover the gold wires 12. An encapsulant 13 is formed on the bottom surface 10b of the packaging substrate 10 and covers an inactive surface 11b and a lateral surface of the semiconductor chip 11. The top surface 10a of the packaging substrate 10 has ball-implanting pads 102 thereon, and solder balls 16 are disposed on the ball-implanting pads 102 for electrically connecting the semiconductor chip 11 to a circuit board (not shown). The package structure 1 (including the solder balls 16) has an overall height equal to 1.1-1.2 mm.

Since the gold wires 12 are used in the prior art, the package structure 1 cannot have a low profile.

Besides, the length of the gold wires 12 results in adverse effect on electric performance (e.g., the capacitance and inductance) of the package structure 1, so the package structure 1 cannot meet the requirements for a wide bandwidth memory.

The package structure 1 having the gold wires 12 is high in fabrication cost.

Therefore, how to overcome the problems in the prior art is becoming one of the most popular issues in the art.

SUMMARY OF THE INVENTION

In view of the above problems of the prior art, the present invention discloses a package structure, including: a metal sheet having perforations; a semiconductor chip having an active surface and an opposite inactive surface, wherein the active surface has electrode pads thereon, conductive bumps are formed on the electrode pads, the semiconductor chip is combined with the metal sheet via the inactive surface, a protective buffer layer is formed on the active surface to cover the conductive bumps, and the perforations are arranged around a periphery of the inactive surface of the semiconductor chip; an encapsulant formed on the metal sheet and in the perforations, for encapsulating the semiconductor chip, and with the protective buffer layer being exposed from the encapsulant; and a circuit fan-out layer disposed on the encapsulant and the protective buffer layer and having conductive vias penetrating the protective buffer layer and electrically connecting to the conductive bumps.

In an embodiment, the package structure further comprises stop blocks made of a non-conductive material and partially embedded in the encapsulant. As a result, the circuit fan-out layer is formed on a part of the stop blocks exposed from the encapsulant and another part of the stop blocks exposed from the encapsulant is exposed to the ambient.

A method of fabricating a package structure is also provided, comprising: providing a semiconductor chip having an active surface and an opposite inactive surface, wherein the active surface has electrode pads thereon, conductive bumps are disposed on the electrode pads, a protective buffer layer is formed on the active surface to cover the conductive bumps, and the semiconductor chip is mounted on a carrier board via the protective buffer layer; combining the inactive surface of the semiconductor chip with a metal sheet having perforations arranged around a periphery of the inactive surface of the semiconductor chip; filling through the perforations a space between the carrier board and the metal sheet with an encapsulant, for encapsulating the semiconductor chip; removing the carrier board so as to expose the protective buffer layer; and forming on the encapsulant and the protective buffer layer a circuit fan-out layer having conductive vias penetrating the protective buffer layer and for electrically connecting the conductive bumps to the conductive vias.

In an embodiment, the carrier board has a release film combined with the protective buffer layer, and the method further comprises disposing on the carrier board a plurality of stop blocks made of a non-conductive material before the inactive surface of the semiconductor chip is combined with the metal sheet.

A package-on-package device is also provided, including a first package structure, a second package structure and solder balls. The first package structure includes a semiconductor chip having an active surface and an opposite inactive surface, wherein the active surface has electrode pads formed thereon, conductive bumps are disposed on the electrode pads, a protective buffer layer is formed on the active surface to cover the conductive bumps, a metal sheet is mounted on the inactive surface and having perforations arranged around a periphery of the inactive surface, an encapsulant formed on the metal sheet and in the perforations for encapsulating the semiconductor chip, with the protective buffer layer being exposed therefrom, and a circuit fan-out layer formed on the encapsulant and the protective buffer layer and having electrical contact pads and conductive vias penetrating the protective buffer layer for electrically connecting the conductive bumps to the conductive vias. The second package structure is installed on the circuit fan-out layer of the first package structure, and the solder balls are exposed for electrically connecting the electrical contact pads and the second package structure.

In an embodiment, the package-on-package device further comprises stop blocks made of a non-conductive material and partially embedded in the encapsulant, allowing the circuit fan-out layer to be formed also on a part of the stop blocks exposed from the encapsulant and another part of the stop blocks exposed from the encapsulant to be exposed to the ambient.

In another embodiment, the second package structure is identical to the first package structure.

In yet another embodiment, the semiconductor chip of the first package structure is a memory chip, and the second package structure comprises an analog chip.

In still another embodiment, the metal sheet is copper, alloy or aluminum and is combined with the inactive surface of the semiconductor chip via a heat conductive adhesive, and the circuit fan-out layer is in a form of built-up structure having an insulation layer and a circuit layer formed on the insulation layer, allowing the conductive vias to penetrate the insulation layer for electrically connecting the circuit layer to the conductive vias.

In other embodiments, on the circuit fan-out layer an insulating protective buffer layer is formed and has a plurality of openings for a portion of the circuit fan-out layer to be exposed therefrom and serve as electrical contact pads.

Since the package structure and method of fabricating the package structure according to the present invention is formed by and employs an embedding technique, electrical connections of the semiconductor chip to an external device is carried out by the circuit fan-out layer and conductive vias as the conductive paths instead of gold wires in the prior art. Thus, not only the height of the entire package structure is reduced to have a low profile, but also the electrical performance is enhanced because the conductive path of the conductive vias is much shorter than that of the gold wires employed in the prior art.

Also, in the method according to the present invention, because the wire bonding method is not necessary, the use of gold material is omitted and the package structure thus fabricated is lower in cost as compared with the prior art.

Moreover, the package-on-package device according to the present invention is low profile in package structure that complies with the industrial specification, the second package structure is smaller in size than the first package structure, and the second package structure has a height less than that of the solder balls for electrically connecting the device to a printed circuit board. Therefore, the package-on-package device has an overall height less than that of a package-on-package device of the prior art. Accordingly, the package-on-package device according to the present invention enhances the performance of a product and meets the need for low profile and compact size.

DETAILED DESCRIPTION OF THE INVENTION

The following illustrates the method for implementing the application by specific embodiments. Whoever has ordinary knowledge in the technical field of the application can easily understand the advantages and efficacy of the application by the context disclosed in the specification.

First Embodiment

Referring to FIGS. 2A to 2G cross-sectional diagrams of a package structure according to the present invention are provided.

Figure 1:
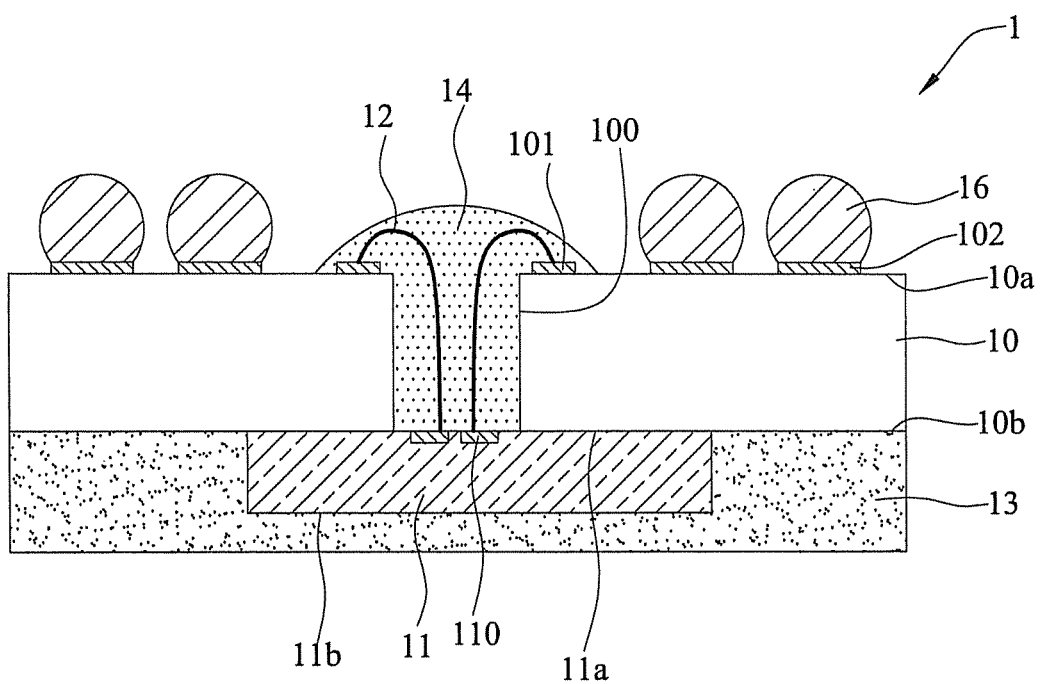
FIG. 1 is a cross-sectional diagram of a package structure according to the prior art.
Figure 2A:
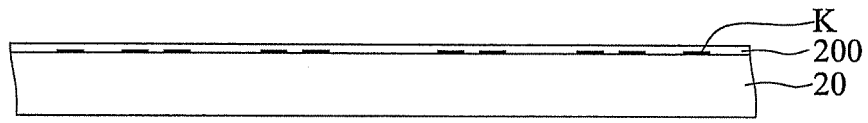
FIGS. 2A to 2G are cross-sectional diagrams illustrating a method of fabricating a package structure according to the present invention, wherein FIG. 2F' is another embodiment of FIG. 2F, and FIGS. 2G(a) to 2G(c) are locally enlarged diagrams of different embodiment of FIG. 2G.

As shown in FIG. 2A, a carrier board 20 is provided, and a plurality of positioning points K and a release film 200 are disposed on a side of the carrier board 20.

Figure 2B:
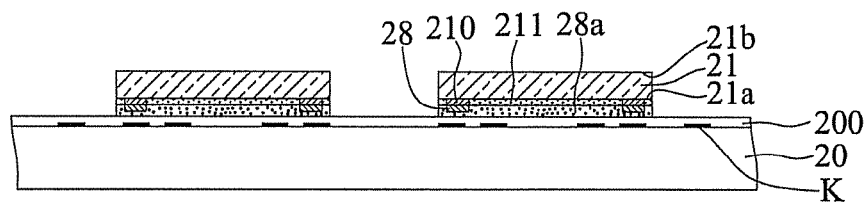

As shown in FIG. 2B, a semiconductor chip 21 such as a memory chip is provided. The semiconductor chip 21 has an active surface 21a and an opposite inactive surface 21b. The active surface 21a has electrode pads 210 and a passivation layer 211 formed thereon. The electrode pads 210 are exposed from the passivation layer 211 and have conductive bumps 28 formed thereon that protrude from the passivation layer 211. A protective buffer layer 28a, made of a material, such as polyimide or epoxy, is formed on the passivation layer 211 of the active surface 21a to cover the conductive bumps 28. The protective buffer layer 28a is aligned, through the use of the positioning points K, and combined with the release film 200.

Figure 2C:
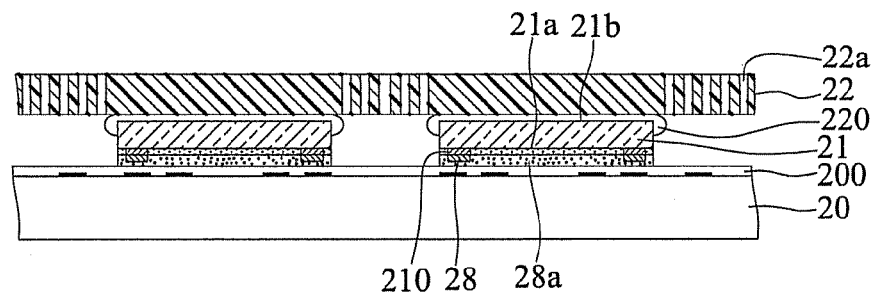

As shown in FIG. 2C, the metal sheet 22 is attached on the inactive surface 21b of the semiconductor chip 21 by a heat conductive adhesive 220. The metal sheet 22 has perforations 22a arranged around a periphery of the inactive surface 21b of the semiconductor chip 21, for dissipating heat generated by the semiconductor chip 21.

As the bandwidth increases, the semiconductor chip 21 generates more heat, so a heat sink is a significant design in a packaging process. The heat sink effectively and rapidly conducts the heat generated by the semiconductor chip 21 to ambient environment.

Figure 2D:
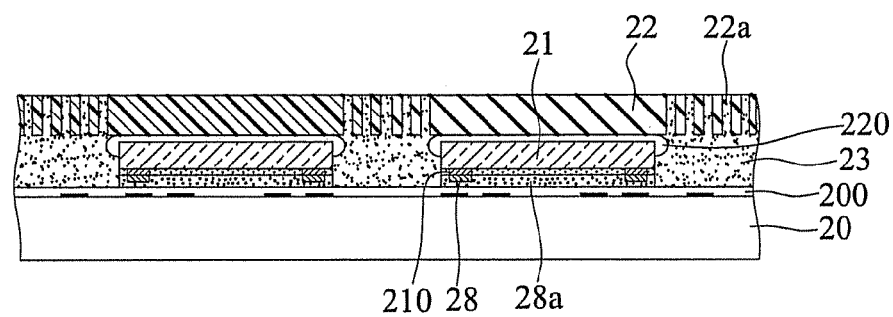

As shown in FIG. 2D, a space between the release film 200 and the metal layer 22 is filled with the encapsulant 23 through the perforations 22a, so as to encapsulate the semiconductor chip 21 and the protective buffer layer 28a.

Figure 2E:
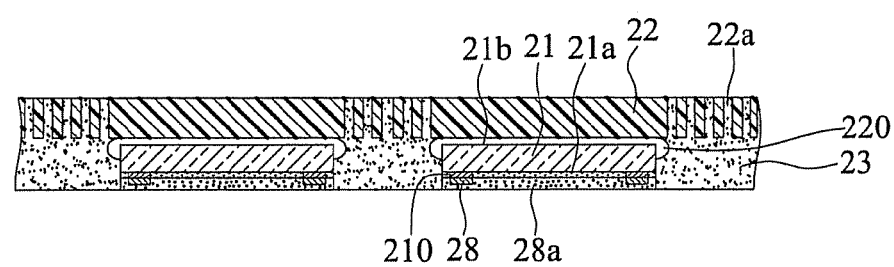

As shown in FIG. 2E, the carrier board 20 is removed with the help of the release film 200, such that the protective buffer layer 28a is exposed from the encapsulant 23.

Figure 2F:
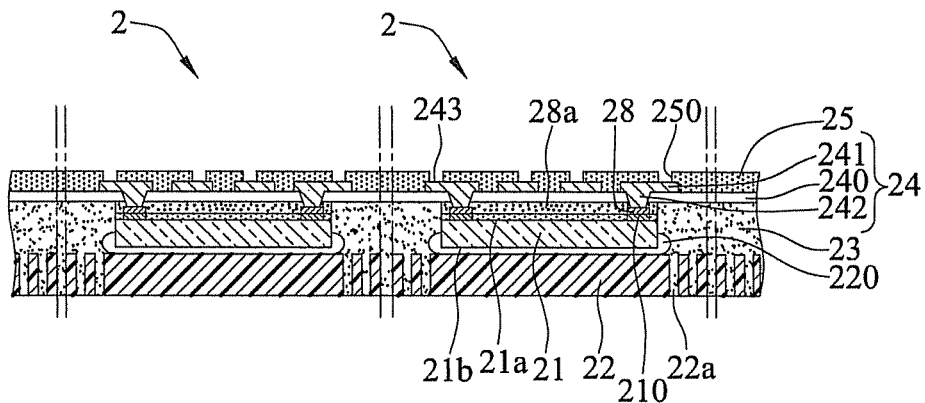
Figure 2F:
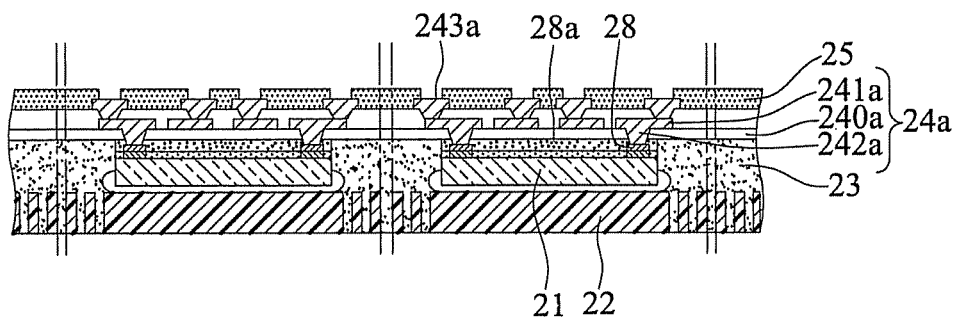

As shown in FIG. 2F, a circuit fan-out layer 24 is formed on the encapsulant 23 and the protective buffer layer 28a and electrically connected to the conductive bumps 28.

In an embodiment, the circuit fan-out layer 24 has an insulation layer 240, a circuit layer 241 formed on the insulation layer 240, and conductive vias 242 penetrating the protective buffer layer 28a and the insulation layer 240 for electrically connecting the conductive bumps 28 and the circuit layer 241. The circuit layer 241 has electrical contact pads 243.

In another embodiment, as shown in FIG. 2F', the circuit fan-out layer 24a is in a form of build-up structure, and has at least an insulation layer 240, a circuit layer 241a formed on the insulation layer 240, and conductive vias 242a formed in the insulation layer 240 for electrically connecting the circuit layer 241a to the conductive vias 242a. Further, the outermost circuit layer 241a has electrical contact pads 243a, and the conductive vias 242a of the lowest layer penetrate the protective buffer layer 28a to be electrically connected to the conductive bumps 28.

An insulating protective layer 25 such as a solder mask is formed on the circuit fan-out layer 24, and a plurality of openings 250 are formed in the insulating protective layer 25 to correspond the electrical contact pads 243 in position to the openings 250.

Figure 2G:
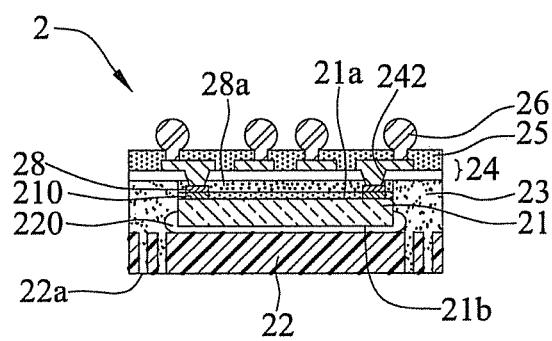
Figure 2G:
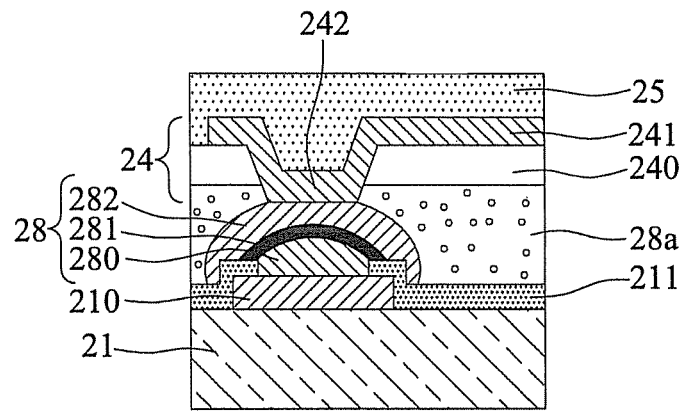
Figure 2G:
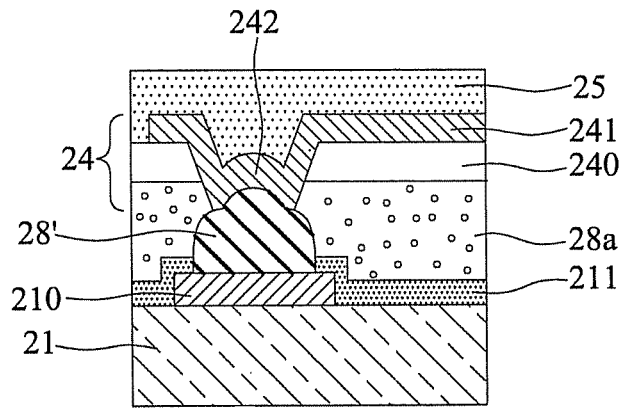
Figure 2G:
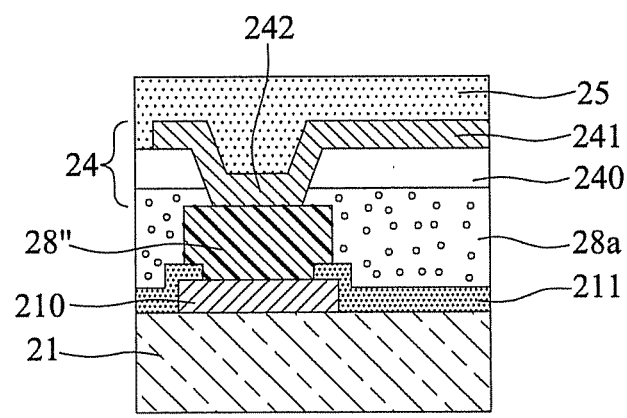

As shown in FIG. 2G, a singulation process is performed subsequently to obtain a plurality of independent package structures 2. In addition, solder balls 26 are formed on the exposed the electrical contact pads 243.

As shown in FIGS. 2G(a) to 2G(c), when the semiconductor chip 21 is provided, conductive bumps 28, 28', 28" are already disposed on the electrode pads 210, and thus the electrode pads 210 can be electrically connected to the conductive vias 242 via the conductive bumps 28, 28', 28". In an embodiment, as shown in FIG. 2G(a), the conductive bumps 28 can be composed of a nickel layer 280, a palladium layer 281 and a copper layer 282. Alternatively, as shown in FIG. 2G(b), the conductive bumps 28' can be gold bumps, such as stud bumps formed by a wire bonding machine. As shown in FIG. 2G(c), the conductive bumps 28" can be copper pillars.

The method of fabricating the package structure 2 according to the present invention combines fan-out and built-up layer techniques to perform the packaging of memory chips by an embedding technique, such that the circuit fan-out layer 24 is electrically connected to the semiconductor chip 21, without using gold wires as an electrically conductive path, as does in the prior art. Thus, the package structure 2 not only has a reduced overall height, but also enhances the electrical performance such as the quality of inductors and capacitors for increasing the bandwidth of the memory, since the conductive paths of the conductive vias 242 are much shorter than those of the gold wires in the prior art.

Besides, the package structure 2 according to the present invention has a coreless structure. Accordingly, the height of package structure 2 can be reduced without using the packaging substrate in the prior art.

Moreover, in the method according to the present invention, the cost can be lowered because the wire bonding is not necessary and the use of gold material is thus reduced.

Second Embodiment

Referring to FIGS. 3A to 3D, cross-sectional diagrams of a method of fabricating a package structure of another embodiment according to the present invention are provided.

Figure 3A:
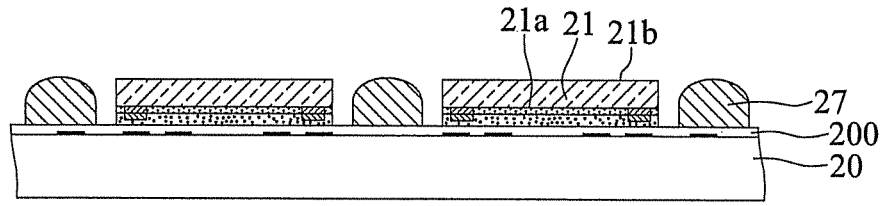
FIGS. 3A to 3D are cross-sectional diagrams illustrating a method of fabricating a package structure in another embodiment according to the present invention.

As shown in FIG. 3A, subsequent to the process performed in FIG. 2B, a plurality of stop blocks 27 that are made of a non-conductive material are formed on the release film 200.

Figure 3B:
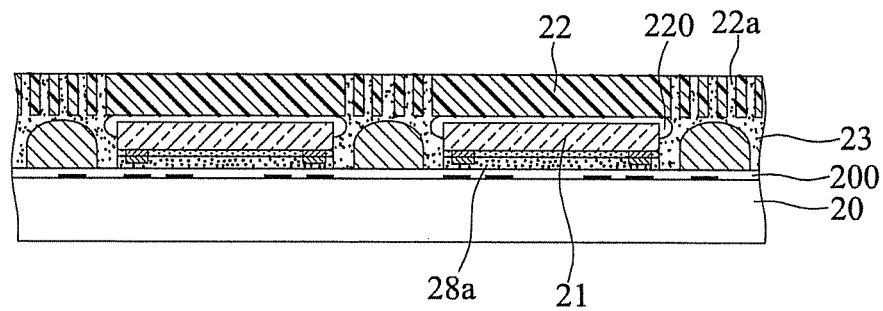

As shown in FIG. 3B, the metal sheet 22 is combined with the semiconductor chip 21, and a space between the release film 200 and the metal sheet 22 is filled with the encapsulant 23 through the perforations 22a to encapsulate the semiconductor chip 21, the protective buffer layer 28a and the stop blocks 27.

Figure 3C:
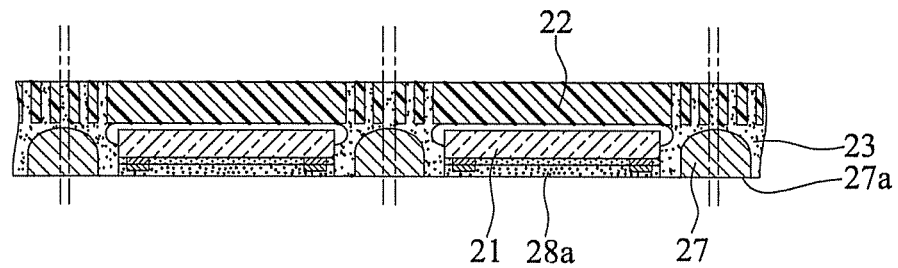

As shown in FIG. 3C, the carrier board 20 is removed with the help of the release film 200 to thereby expose the surfaces 27a of the stop blocks 27 and the protective buffer layer 28a.

Figure 3D:
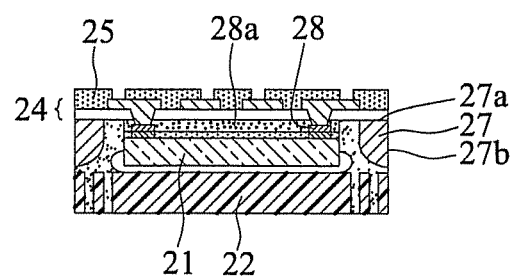

As shown in FIG. 3D, a circuit fan-out layer 24 is formed on the encapsulant 23, the exposed surfaces 27a of the stop blocks 27 and the protective buffer layer 28a and electrically connected to the conductive bumps 28, and an insulating protective layer 25 is formed. A singulation process is performed to expose sides 27b of the stop blocks 27.

The present invention also provides a package structure 2, including a semiconductor chip 21 having an active surface 21a and an opposite inactive surface 21b, a metal sheet 22 combined with the inactive surface 21b of the semiconductor chip 21, an encapsulant 23 formed on the metal sheet 22 and covering the inactive surface 21b of the semiconductor chip 21, and a circuit fan-out layer 24 formed on the encapsulant 23.

The active surface 21a of the semiconductor chip 21 has electrode pads 210 thereon, the conductive bumps 28 are disposed on the electrode pads 210, and the protective buffer layer 28a is formed on the active surface 21a and covers the conductive bumps 28.

The metal sheet 22 is made of copper, alloy or aluminum, and has perforations 22a arranged around a periphery of the active surface 21b of the semiconductor chip 21, and is combined with the inactive surface 21b by the heat conductive adhesive 220.

The encapsulant 23 is further formed in the perforations 22a, with the protective buffer layer 28a being exposed.

The circuit fan-out layer 24 is further formed on the protection layer 28a, and has conductive vias 242 that penetrate the protective buffer layer 28a for electrically connecting the conductive bumps 28 to the conductive vias 242. The circuit fan-out layer 24 further has at least an insulation layer 240, a circuit layer 241 formed on the insulation layer 240, and conducting vias 242 penetrating the insulation layer 240 and electrically connected to the circuit layer 241. On the circuit fan-out layer 241 is the insulating protective layer 25. The insulating protective layer 25 has a plurality of openings 250 to correspond a portion of the circuit layer 241 in position to the openings 250 as electrical contact pads 243.

The package structure 2 also includes solder balls 26 disposed on the exposed surface of the electrical contact pads 243.

The package structure 2 also includes stop blocks 27 made of a non-conductive material partially embedded in the encapsulant 23. The circuit fan-out layer 24 is further formed on the surfaces 27a of the stop blocks 27, with sides 27b of the stop blocks 27 being exposed to the ambient.

Figure 4:
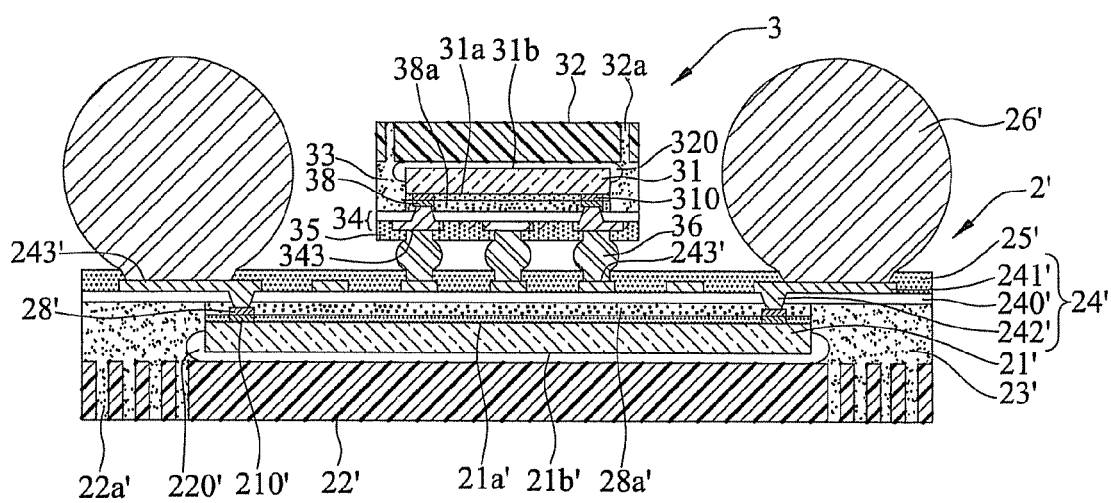
FIG. 4 is a cross-sectional diagram of a package-on-package device according to the present invention.

Referring to FIG. 4, a package-on-package device according to the present invention includes two package structures fabricated by the above method. The package-on-package device includes a first package structure 2', a second package structure 3, and solder balls that electrically connect the first package structure 2' and the second package structure 3.

In an embodiment, the first package structure 2' is similar to the second package structure 3. The difference lies in that the semiconductor chip 21' of the first package structure 2' is a memory, while the semiconductor chip 31 of the second package structure 3 is a control-typed chip. In other embodiment, the second package structure and the first package structure are completely the same.

The first package structure 2' includes a semiconductor chip 21 having an active surface 21a' and an opposite inactive surface 21b', a metal sheet 22' combined with the inactive surface 21b', an encapsulant 23' formed on the metal sheet 22' for encapsulating the semiconductor chip 21', and a circuit fan-out layer 24' formed on the encapsulant 23.

The active surface 21a' of the semiconductor chip 21' has electrode pads 210' thereon, conductive bumps 28' are disposed on the electrode pads 210', and a protective buffer layer 28a' is formed on the active surface 21a' and covers the conductive bumps 28'. The metal sheet 22' has perforations 22a' located on the inactive surface 21b', and is combined with the inactive surface 21b' by a heat conductive adhesive 220'. The encapsulant 23' is further formed in the perforations 22a', with the protective buffer layer 28a' being exposed thereupon. The circuit fan-out layer 24' is further disposed on the protective buffer layer 28a', and has an insulation layer 240', a circuit layer 241' formed on the insulation layer 240', and conductive vias 242' penetrating the protective buffer layer 28a' and insulation layer 240' and electrically connecting the circuit layer 241' and the conductive bumps 28'. An insulating protective layer 25' is formed on the circuit fan-out layer 24' and exposes the electrical contact pads 243' of the circuit fan-out layer 24'.

The second package structure 3 includes a semiconductor chip 31 having an active surface 31a and an opposite inactive surface 31b, a metal sheet 32 combined with the inactive surface 31b, an encapsulant 33 formed on the metal sheet 32 for encapsulating the semiconductor chip 31, and a circuit fan-out layer 34 formed on the encapsulant 33.

The active surface 31a of the semiconductor 31 has electrode pads 310 thereon, conductive bumps 38 are disposed on the electrode pads 310, and a protective buffer layer 38a is formed on the active surface 31b for covering the conductive bumps 38. The semiconductor chip 31 is an analog chip such as a controlling chip, a power managing chip, or a protective chip preventing electrostatic discharge. The metal sheet 32 has perforations 32a arranged around a periphery of the inactive surface 31b and is combined with the inactive surface 31b by a heat conductive adhesive 320. The encapsulant 33 is further formed in the perforations 32a, with the protective buffer layer 38a being exposed thereupon. The circuit fan-out layer 34 is further formed on the protective buffer layer 38a and electrically connected to the conductive bumps 38. In addition, an insulating protective layer 35 is formed on the circuit fan-out layer, with the electrical contact pads 343 of the circuit fan-out layer 34 being exposed so as for the electrical contact pads 343 to be electrically connected to a portion of electrical contact pads 243' of the first package structure 2' by the solder balls 36.

Moreover, another portion of electrical contact pads 243' of the first packaging substrate 2' are also combined with solder balls 26' to be electrically connected to an external device such as a printed circuit board (not shown).

The package-on-package device according to the present invention is fabricated according to the electrical regulation with a thinner size via an embedding technique. Not only the second package structure 3 can be smaller is size than that of the first package structure 2', but also the height of the second package structure 3 can be smaller than that of the solder balls for electrically connecting of the circuit board, resulting in the height of the entire package-on-package device to be 0.4-0.6 mm (smaller than the height of the package structure 0.8-1.2 mm according to the prior art). Thus, compared to the prior art, the package-on-package device according to the present invention not only can enhance function of product, but also achieve the purpose of thinning.

To sum up, according to the present invention for the package structure and fabricating method thereof, by embedding the semiconductor chip, wherein electrical connections to the semiconductor chip is carried out by the circuit fan-out layer and conductive vias instead of gold wires, the package structure has a reduced overall height and much shorter conductive paths, thereby achieving the purpose of thinning and enhancing electrical performance.

Besides, the package-on-package device also has a reduced height, and the purposes of low profile and compact size are achieved.

Also, the package structure fabricated by the method according to the present invention has a low cost since the wire bonding process is not necessary.

The embodiments illustratively explain the theory and the efficacy according to the present invention rather than limiting the present invention. Whoever has ordinary knowledge in the technical field of the present invention can modify the embodiments without departing from the spirit and the scope of the present invention. Thus, the rights protection of the present invention should be listed as the following claims.

What is claimed is:

1. A package structure, comprising:
   a metal sheet having perforations;
   a semiconductor chip having an active surface and an opposite inactive surface, wherein the active surface has electrode pads thereon, conductive bumps are disposed on the electrode pads, the semiconductor chip is combined with the metal sheet by the inactive surface, a protective buffer layer is formed on the active surface to cover the conductive bumps, and the perforations are arranged around a periphery of the inactive surface of the semiconductor chip;
   an encapsulant formed on the metal sheet and in the perforations, for encapsulating the semiconductor chip, in a manner that the protective buffer layer is exposed from the encapsulant; and
   a circuit fan-out layer formed on the encapsulant and the protective buffer layer and having conductive vias penetrating the protective buffer layer and electrically connecting to the conductive bumps.

2. The package structure of claim 1, further comprising a heat conductive adhesive for adhering the metal sheet to the inactive surface of the semiconductor chip.

3. The package structure of claim 1, wherein the circuit fan-out layer is in a form of built-up structure having an insulation layer and a circuit layer disposed on the insulation layer, such that the conductive vias penetrate the insulation layer and are electrically connected to the circuit layer.

4. The package structure of claim 1, further comprising an insulating protective layer formed on the circuit fan-out layer and having a plurality of openings for a portion of the circuit fan-out layer to be exposed therefrom and serve as electrical contact pads.

5. The package structure of claim 1, further comprising stop blocks made of a non-conductive material and partially embedded in the encapsulant, wherein the circuit fan-out layer is further on a part of the stop blocks exposed from the encapsulant and another part of the stop blocks exposed from the encapsulant is exposed to the enviroment.

6. A package-on-package device, comprising:
   a first package structure including:
      a metal sheet having perforations;
      a semiconductor chip having an active surface and an opposite inactive surface, wherein the active surface has electrode pads thereon, conductive bumps are formed on the electrode pads, a protective buffer layer is formed on the active surface to cover the conductive bumps, the semiconductor chip is combined with the metal sheet via the inactive surface, and the perforations of the metal sheet are arranged around a periphery of the inactive surface;
      an encapsulant formed on the metal sheet and in the perforations for encapsulating the semiconductor chip and exposing the protective buffer layer from the perforations; and
      a circuit fan-out layer formed on the encapsulant and the protective buffer layer and having electrical contact pads and conductive vias penetrating the protective buffer layer and electrically connecting to the conductive bumps; and a second package structure installed on the circuit fan-out layer of the first package structure and electrically connected to the electrical contact pads through solder balls.

7. The package-on-package device of claim 6, further comprising a heat conductive adhesive for adhering the metal sheet to the inactive surface of the semiconductor chip.

8. The package-on-package device of claim 6, wherein the circuit fan-out layer is in a form of built-up structure having an insulation layer and a circuit layer formed on the insulation layer, and the conductive vias penetrate the insulation layer for being electrically connected to the circuit layer.

9. The package-on-package device of claim 6, wherein the circuit fan-out layer has an insulating protective buffer layer having a plurality of openings for the electrical contact pads to be exposed therefrom and combined with the solder balls.

10. The package-on-package device of claim 6, further comprising stop blocks made of a non-conductive material and partially embedded in the encapsulant, wherein the circuit fan-out layer is further formed on a part of the stop blocks exposed from the encapsulant and another part of the stop blocks exposed from the encapsulant is exposed to the ambient.

11. The package-on-package device of claim 6, wherein the second package structure is identical to the first package structure.

12. The package-on-package device of claim 6, wherein the semiconductor chip of the first package structure is a memory chip, and the second package structure has an analog chip.

* * * * *